US006569585B2

United States Patent
Caspar et al.

(10) Patent No.: US 6,569,585 B2
(45) Date of Patent: May 27, 2003

(54) THERMAL IMAGING PROCESS AND PRODUCTS USING IMAGE RIGIDIFICATION

(75) Inventors: Jonathan V. Caspar, Henry Clay Village, DE (US); Harvey Walter Taylor, Jr., Sayre, PA (US); Gregory C. Weed, Towanda, PA (US); Rolf S. Gabrielsen, Binghamton, NY (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/188,518

(22) Filed: Jul. 3, 2002

(65) Prior Publication Data

US 2003/0064302 A1 Apr. 3, 2003

Related U.S. Application Data

(60) Continuation of application No. 09/919,623, filed on Jul. 31, 2001, now abandoned, which is a division of application No. 09/419,680, filed on Oct. 15, 1999, now Pat. No. 6,294,308.

(51) Int. Cl.$^7$ .................................. B03C 3/00
(52) U.S. Cl. .................. 430/14; 430/15; 430/256; 430/257; 430/259; 430/263; 430/200; 430/201; 430/339; 430/430; 430/944
(58) Field of Search ................. 430/259, 263, 430/256, 237, 200, 201, 11, 14, 15, 339, 944, 430

(56) References Cited

U.S. PATENT DOCUMENTS

| 3,852,093 A | | 12/1974 | O'Leary |
| 4,643,917 A | | 2/1987 | Koshizuka et al. |
| 4,700,207 A | | 10/1987 | Vanier et al. |
| 4,719,169 A | | 1/1988 | Platzer et al. |
| 4,720,480 A | | 1/1988 | Ito et al. |
| 4,769,459 A | | 9/1988 | Patel et al. |
| 4,778,128 A | | 10/1988 | Wright et al. |
| 4,912,085 A | | 3/1990 | Marbrow |
| 4,927,803 A | * | 5/1990 | Bailey et al. ............... 428/195 |
| 4,942,141 A | | 7/1990 | DeBoer et al. |
| 4,948,776 A | | 8/1990 | Evans et al. |
| 4,948,777 A | | 8/1990 | Evans et al. |
| 4,948,778 A | | 8/1990 | DeBoer |
| 4,950,639 A | | 8/1990 | DeBoer et al. |
| 4,952,552 A | | 8/1990 | Chapman et al. |
| 4,999,266 A | | 3/1991 | Platzer et al. |
| 5,017,547 A | | 5/1991 | Deboer |
| 5,019,549 A | | 5/1991 | Kellogg et al. |
| 5,085,698 A | | 2/1992 | Ma et al. |
| 5,093,168 A | | 3/1992 | Suzuki et al. |
| 5,130,292 A | | 7/1992 | Ito et al. |
| 5,156,938 A | | 10/1992 | Foley et al. |
| 5,171,650 A | | 12/1992 | Ellis et al. |
| 5,185,233 A | * | 2/1993 | Santo ........................ 430/270 |
| 5,192,630 A | | 3/1993 | Platzer |
| 5,219,703 A | | 6/1993 | Bugner et al. |
| 5,232,817 A | * | 8/1993 | Riley ........................ 430/256 |
| 5,256,506 A | | 10/1993 | Ellis et al. |
| 5,258,247 A | | 11/1993 | Platzer |
| 5,278,023 A | * | 1/1994 | Bills et al. .................. 430/201 |
| 5,278,576 A | | 1/1994 | Kaszczuk et al. |
| 5,300,398 A | | 4/1994 | Kaszczuk |
| 5,334,573 A | | 8/1994 | Schild |
| 5,427,847 A | | 6/1995 | Zawada |
| 5,593,808 A | | 1/1997 | Ellis |
| 5,622,795 A | | 4/1997 | Ellis |
| 5,681,681 A | | 10/1997 | Ellis |
| 5,733,845 A | | 3/1998 | Brust et al. |
| 5,773,188 A | | 6/1998 | Ellis |
| 5,774,164 A | | 6/1998 | Yamazaki et al. |
| 5,821,028 A | | 10/1998 | Macjima et al. |
| 5,834,154 A | | 11/1998 | Yamazaki et al. |
| 5,843,617 A | | 12/1998 | Patel et al. |
| 5,935,758 A | * | 8/1999 | Patel et al. ................. 430/200 |
| 5,943,084 A | | 8/1999 | Yamazaki et al. |
| 5,972,838 A | | 10/1999 | Pearce et al. |
| 6,165,698 A | * | 12/2000 | Kawamura et al. ......... 430/257 |

FOREIGN PATENT DOCUMENTS

| EP | 0675003 | 10/1995 |
| GB | 2083726 | 3/1982 |

* cited by examiner

Primary Examiner—Richard L. Schilling

(57) ABSTRACT

Improved processes and products for laser thermal imaging are described. These improved processes and products utlilize an image rigidification element and significantly reduce halftone dot movement, swath boundary cracking and banding.

40 Claims, 2 Drawing Sheets

THERMAL IMAGING PROCESS AND PRODUCTS USING IMAGE RIGIDIFICATION

FIELD OF THE INVENTION

This invention relates to improved processes and products for effecting laser-induced thermal transfer imaging.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, U.K. Pat. No. 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains a thermally imageable layer, the exposed areas of which are transferred, and (b) a receiver element that are in contact. The laserable assemblage is imagewise exposed by a laser, usually an infrared laser, resulting in transfer of exposed areas of the thermally imageable layer, also referred to as material, from the donor element to the receiver element. The (imagewise) exposure takes place only in a small, selected region of the laserable assemblage at one time, so that transfer of material from the donor element to the receiver element can be built up one pixel at a time. Computer control produces transfer with high resolution and at high speed. The laserable assemblage, upon imagewise exposure to a laser as described supra, is henceforth termed an imaged laserable assemblage.

Laser-induced processes are generally faster than analog processes and may result in transfer of material with high resolution. However, such laser imaging processes that image to a temporary receiver not only have defects and limitations associated with the imaging process but also in the processes and materials used to transfer images from the temporary image receiver to the final substrate. One such defect that occurs is dot movement where a row of dots (or some individual dots within the row) move during the imaging or image transfer processes resulting in a visible white area in the colored image or a distortion in color and resolution. Another potential imaging defect is "banding", which can be associated to a write engine with an external drum configuration. "Banding" can be defined as a defect where the thermally transferred material deposited on the temporary receiver in one revolution of the external drum write engine does not exactly meet (butt) the thermally transferred material deposited in the subsequent drum rotation. The result is a "white line" in the image area of some dimension. The "banding" defect can be reduced by "overwriting or overlapping" the deposited material in the previous drum rotation with the deposited polymer material in the successive drum rotation (as opposed to "butting" the two deposited materials in 2 drum rotations). The slight "overwrite or overlap" of the two deposited materials reduces or eliminates the "space" between the deposited polymer materials in two successive drum rotations. Another problematic defect associated with both the imaging and subsequent image transfer steps can be called swath boundary cracking. This defect manifests itself where a non-uniform deposition of material occurs between successive drum revolutions. Compared to the "banding" defect where a space occurs between the deposited materials of two drum revolutions, swath boundary cracking has a very small amount of material deposited in the "space" and when the image is transferred to the final substrate by high temperature and pressure lamination—a crack occurs in the "boundary" area between the two successively deposited materials.

Another limitation of current processes involving the physical transfer of images from a temporary image receiver to the final substrate is the lamination conditions. The image built up on the temporary image receiver sheet must be transferred to the final or permanent substrate (usually paper) via an acceptable lamination process. The lamination conditions must be controlled in a narrow range, and even so, the lamination conditions limit image quality, productivity, process latitude and the type of permanent substrate used.

Furthermore, another severe limitation present in the use of NIR (near infrared) dyes in the thermally imageable layer or colored layer of the donor or thermally imageable element is that color purity is sacrificed in the transferred image. The NIR dye imparts undesired color in the image areas.

Consequently, a need exists for a process for providing color images, which operates effectively at the highest speeds possible (greater productivity) and lamination latitude, and which affords the highest achievable image quality on receiver elements upon thermal imaging and subsequent image transfer processes to the permanent substrate. A need also exists for a process that provides flexibility in the type of permanent substrates that may be used. A need also exists for a process that provides a vehicle or mechanism for eliminating the color impurities associated with the use of NIR dyes in the system. To date, most NIR dyes absorbing in the actinic region of diode lasers (830 nm) have long absorbing "tails" into the visible spectrum (400–700 nm) which give rise to significant undesired color in image areas. A need further exists for new assemblages, image proofing systems, printed proofs and similar products which overcome the shortcomings described above.

SUMMARY OF THE INVENTION

Improved processes and products for laser induced thermal imaging are disclosed herein.

In a first embodiment, this invention provides a method for making a color image comprising:

(1) imagewise exposing to laser radiation a laserable assemblage comprising:
 (A) the thermally imageable element comprising a thermally imageable layer; and
 (B) a receiver element in contact with the thermally imageable layer of the thermally imageable element; the receiver element comprising:
  (a) an image receiving layer; and
  (b) an receiver support; whereby the exposed areas of the thermally imageable layer are transferred to the receiver element to form a colored image on the image receiving layer;

(2) separating the thermally imageable element (A) from the receiver element (B), thereby revealing the colored image on the image receiving layer of the receiver element;

(3) contacting the colored image on the image receiving layer of the receiver element with an image rigidification element comprising:

(a) a support having a release surface, and
(b) a thermoplastic polymer layer, the colored image being adjacent the thermoplastic polymer layer during said contacting, whereby the color image is encased between the thermoplastic polymer layer and the image receiving layer of the receiving element;

(4) removing the support having a release surface thereby revealing the thermoplastic polymer layer; and (5) contacting the revealed thermoplastic polymer layer from step (4) with a permanent substrate.

Preferably, the thermally imageable element is formed by applying a thermally imageable layer comprising a colorant to a base element.

In a separate embodiment, this invention provides a method for making a color image, further comprising after step (5):

(6) removing the receiver support.

In another embodiment, the invention provides a method of bleaching a polymethine type NIR dye contained in a laserable assemblage which comprises contacting the dye in the laserable assemblage with a oxidant type bleaching agent selected from the group consisting of hydrogen peroxide, organic peroxides, hexaaryl biimidazoles, halogenated organic compounds, persulfates, perborates, perphosphates, hypochlorites and azo compounds; whereby the NIR dye is bleached by the bleaching agent.

In still another embodiment, the invention provides an image proofing system comprising:

(a) a laser generated halftone dot color thermal image formed on a crystalline polymer layer, the crystalline polymer layer being located on a first temporary carrier; and (b) a thermoplastic polymer layer laminated to the crystalline polymer layer whereby the color image is encased between the crystalline polymer layer and the thermoplastic polymer layer, the thermoplastic polymer layer being located on a second temporary carrier.

In still another embodiment, the invention provides a printed proof comprising:

(a) a laser generated halftone dot color thermal image formed on a crystalline polymer layer; and (b) a thermoplastic polymer layer laminated on one surface to the crystalline polymer layer and on the other surface to a final receptor, whereby the color image is encased between the crystalline polymer layer and the thermoplastic polymer layer.

DETAILED DESCRIPTION OF THE INVENTION

Improved processes and products for laser induced thermal transfer imaging are disclosed wherein defects such as dot movement, banding, swath boundary cracking and restricted lamination conditions are greatly reduced, rendered less perceptible or substantially eliminated. Productivity is markedly improved, e.g., by increasing the through-put lamination speeds from 200 mm/min. to 600–800 mm/min (3–4 fold increase) for the thermal multicolor image transfer from the receiving element to the permanent substrate, e.g., by lamination. This invention also broadens lamination conditions and allows for the use of several different permanent substrates.

Before the improved processes of this invention are described in further detail, several exemplary laserable assemblages will be described. The processes of this invention are fast and are preferably conducted using one of these laserable assemblages to afford with high sensitivity upon laser imaging an image having higher quality in comparison to those for comparative processes (prior art).

Thermally Imageable Element or Donor Element

Figure 1:
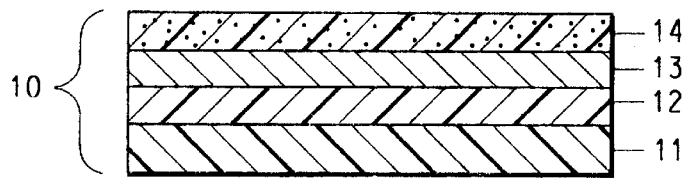
FIG. 1 illustrates a donor or thermally imageable element (10) useful in the invention having a support (11); a base element having a coatable surface comprising a flexible ejection layer or subbing layer (12) and a heating layer (13); and a thermally imageable colored layer (14).

As shown in FIG. 1, an exemplary donor element useful for thermal imaging in accordance with the processes of this invention comprises a thermally imageable or colored layer (14), which is also referred to as a transfer layer, and a base element having a coatable surface which comprises an optional ejection layer or subbing layer (12) and a heating layer (13). Each of these layers has separate and distinct functions as described, infra. Optionally, a donor support (11) may also be present. In one embodiment, the heating layer (13) may be present directly on the support (11).

Base Element

One preferred base element comprises an ejection or subbing layer (12), optionally on a support (11), and a heating layer (13).

Support

Preferably, the support is a thick (400 guage) coextruded polyethylene terephthalate film. Alternately, the support may be a polyester, specifically polyethylene terephthalate that has been plasma treated to accept the heating layer. When the support is plasma treated, a subbing layer or ejection layer is usually not provided on the support. Backing layers may optionally be provided on the support. These backing layers may contain fillers to provide a roughened surface on the back side of the support. Alternately, the support itself may contain fillers, such as silica, to provide a roughened surface on the back surface of the support.

Ejection or Subbing Layer

The flexible ejection layer or subbing layer (12), as shown in FIG. 1, is the layer that provides the force to effect transfer of the thermally imageable layer to the receiver element in the exposed areas. When heated, this layer decomposes into gaseous molecules providing the necessary pressure to propel or eject the exposed areas of the thermally imageable layer onto the receiver element. This is accomplished by using a polymer having a relatively low decomposition temperature (less than about 350° C., preferably less than about 325° C., and more preferably less than about 280° C.). In the case of polymers having more than one decomposition temperature, the first decomposition temperature should be lower than 350° C. Furthermore, in order for the ejection layer to have suitably high flexibility and conformability, it should have a tensile modulus that is less than or equal to 2.5 Gigapascals (GPa), preferably less than 1.5 GPa, and more preferably less than 1 Gigapascal (GPa). The polymer chosen should also be one that is dimensionally stable. If the laserable assemblage is imaged through the donor flexible ejection layer, the flexible ejection layer should be capable of transmitting the laser radiation, and not be adversely affected by this radiation.

Examples of suitable polymers include (a) polycarbonates having low decomposition temperatures (Td), such as polypropylene carbonate; (b) substituted styrene polymers having low decomposition temperatures, such as poly(alpha-methylstyrene); (c) polyacrylate and polymethacrylate esters, such as polymethylmethacrylate and polybutyl-methacrylate; (d) cellulosic materials having low decomposition temperatures (Td), such as cellulose acetate butyrate and nitrocellulose; and (e) other polymers such as polyvinyl chloride; poly(chlorovinyl chloride) polyacetals; polyvinylidene chloride; polyurethanes with low Td; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymethacrylate esters, low Td polycarbonates, nitrocellulose, poly(vinyl chloride) (PVC), and chlorinated poly(vinyl chloride) (CPVC). Most preferred are poly(vinyl chloride) and chlorinated poly(vinyl chloride).

Other materials can be present as additives in the ejection layer as long as they do not interfere with the essential function of the layer. Examples of such additives include coating aids, flow additives, slip agents, antihalation agents plasticizers, antistatic agents, surfactants, and others which are known to be used in the formulation of coatings.

Alternately, a subbing layer (12) maybe provided in place of the ejection layer resulting in a donor element having in order at least one subbing layer (12), at least one heating layer (13), and at least one colored layer(14). Some suitable subbing layers include polyurethanes, polyvinyl chloride, cellulosic materials, acrylate or methacrylate homopolymers and copolymers, and mixtures thereof. Other custom made decomposable polymers may also be useful in the subbing layer. Preferably useful as subbing layers for polyester, specifically polyethylene terephthalate, are acrylic subbing layers. Preferably, the subbing layer has a thickness of 100 to 1000 A.

Heating Layer

The heating layer (13), as shown in FIG. 1, is deposited on the flexible ejection or subbing layer. The function of the heating layer is to absorb the laser radiation and convert the radiation into heat. Materials suitable for the layer can be inorganic or organic and can inherently absorb the laser radiation or include additional laser-radiation absorbing compounds.

Examples of suitable inorganic materials are transition metal elements and metallic elements of Groups IIIa, IVa, Va, VIa, VIII, IIIb, and Vb, their alloys with each other, and their alloys with the elements of Groups Ia and IIa. Tungsten (W) is an example of a Group VIa metal that is suitable and which can be utilized. Carbon (a Group IVb nonmetallic element) can also be used. Preferred metals include Al, Cr, Sb, Ti, Bi, Zr, TiO2, Ni, In, Zn, and their alloys; carbon is a preferred nonmetal. More preferred metals and nonmetals include Al, Ni, Cr, Zr and C. Most preferred metals are Al, Ni, Cr, and Zr.

The thickness of the heating layer is generally about 20 Angstroms to 0.1 micrometer, preferably about 40 to 100 Angstroms.

Although it is preferred to have a single heating layer, it is also possible to have more than one heating layer, and the different layers can have the same or different compositions, as long as they all function as described above. The total thickness of all the heating layers should be in the range given above, i.e., 20 Angstroms to 0.1 micrometer.

The heating layer(s) can be applied using any of the well-known techniques for providing thin metal layers, such as sputtering, chemical vapor deposition, and electron beam.

Thermally Imageable or Colored Layer

The thermally imageable or colored layer (14), also known as the transfer layer, which is formed by applying a colorant containing composition to a base element, comprises (i) a polymeric binder which is different from the polymer in the ejection layer, and (ii) a colorant.

The polymer (binder) for the colored layer is a polymeric material having a decomposition temperature that is greater than 300° C. and preferably greater than 350° C. The binder should be film forming and coatable from solution or from a dispersion. Binders having melting points less than about 250° C. or plasticized to such an extent that the glass transition temperature is <70° C. are preferred. However, heat-fusible binders, such as waxes should be avoided as the sole binder since such binders may not be as durable, although they are useful as cobinders in decreasing the melting point of the top layer.

It is preferred that the binder (polymer) does not self-oxidize, decompose or degrade at the temperature achieved during the laser exposure so that the exposed areas of the thermally imageable layer comprising colorant and binder, are transferred intact for improved durability. Examples of suitable binders include copolymers of styrene and (meth) acrylate esters, such as styrene/methyl-methacrylate; copolymers of styrene and olefin monomers, such as styrene/ethylene/butylene; copolymers of styrene and acrylonitrile; fluoropolymers; copolymers of (meth)acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

Preferred polymers for the colored layer include, but are not limited to, acrylate homopolymers and copolymers, methacrylate homopolymers and copolymers, (meth) acrylate block copolymers, and (meth)acrylate copolymers containing other comonomer types, such as styrene.

The binder (polymer) generally has a concentration of about 15–50% by weight, based on the total weight of the colored layer, preferably 30–40% by weight.

The thermally imageable layer also comprises a colorant. The colorant can be a pigment or a dye, preferably a non-sublimable dye. It is preferred to use a pigment as the colorant for stability and for color density, and also for the high decomposition temperature. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used. For color filter array applications, high transparency pigments (that is at least about 80% of light transmits through the pigment) are preferred, having small particle size (that is about 100 nanometers).

In accordance with principles well known to those skilled in the art, the concentration of colorant will be chosen to achieve the optical density desired in the final image. The amount of colorant will depend on the thickness of the active coating and the absorption of the colorant. Optical densities greater than 1.3 at the wavelength of maximum absorption are typically required. Even higher densities are preferred. Optical densities in the 2–3 range or higher are achievable with application of this invention.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in Assignees, U.S. Pat. No. 5,085,698 issued Feb. 4, 1992. Conventional pigment dispersing techniques, such as ball milling, sand milling, etc., can be employed.

The colorant is present in an amount of from about 25 to 95% by weight, preferably 35–65% by weight, based on the total weight of the colored layer composition. Although the above discussion was directed to color proofing, the element and process of the invention apply equally to the transfer of other types of materials in different applications. In general, the scope of the invention is intended to include any application in which solid material is to be applied to a receptor in a pattern.

The colored layer may be coated on the base element from a solution in a suitable solvent, however, it is preferred to coat the layer(s) from a dispersion. Any suitable solvent can be used as a coating solvent, as long as it does not deleteriously affect the properties of the assemblage, using conventional coating techniques or printing techniques, for example, gravure printing. A preferred solvent is water. The coating of the colored layer may also be accomplished using the WaterProof® Color Versatility Coater sold by DuPont, Wilmington, Del. Coating of the colored layer can thus be achieved shortly before the exposure step. This also allows for the mixing of various basic colors together to fabricate a wide variety of colors to match the Pantone® color guide currently used as one of the standards in the proofing industry.

Thermal Amplification Additive

A thermal amplification additive is optionally, and preferably, present in the ejection layer(s), subbing layer or the colored layer. It can also be present in both of these layers.

The function of the additive is to amplify the effect of the heat generated in the heating layer and thus to further increase sensitivity. The additive should be stable at room temperature. The additive can be (1) a compound which, when heated, decomposes to form gaseous byproducts(s), (2) a dye which absorbs the incident laser radiation, or (3) a compound which undergoes a thermally induced unimolecular rearrangement which is exothermic. Combinations of these types of additives may also be used.

Thermal amplification additives which decompose upon heating include those which decompose to form nitrogen, such as diazo alkyls, diazonium salts, and azido (-N3) compounds; ammonium salts; oxides which decompose to form oxygen; carbonates; peroxides, Mixtures of additives can also be used. Preferred thermal amplification additives of this type are diazo compounds such as 4-diazo-N,N' diethyl-aniline fluoroborate (DAFB).

When the absorbing dye is incorporated in the ejection or subbing layer, its function is to absorb the incident radiation and convert this into heat, leading to more efficient heating. It is preferred that the dye absorb in the infrared region. For imaging applications, it is also preferred that the dye have very low absorption in the visible region. Examples of suitable NIR (near infrared absorbing) dyes which can be used alone or in combination include poly(substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; and quinoid dyes.

Infrared absorbing materials disclosed in U.S. Pat. Nos. 4,778,128; 4,942,141; 4,948,778; 4,950,639; 5,019,549; 4,948,776; 4,948,777 and 4,952,552 may also be suitable herein. The weight percentage of the thermal amplification additive, versus, for example, the total solid weight composition of the ejection or subbing layer may range from 0–20%. When present in the colored layer, the thermal amplification weight percentage is generally at a level of 0.95–11.5%. The percentage can range up to 25% of the total weight percentage in the colored layer. These percentages are non-limiting and one of ordinary skill in the art can vary them depending upon the particular composition of the ejection layer or colored layer.

The colored layer generally has a thickness in the range of about 0. 1 to 5 micrometers, preferably in the range of about 0.1 to 1.5 micrometers. Thicknesses greater than about 5 micrometers are generally not preferred as they require excessive energy in order to be effectively transferred to the receiver.

Although it is preferred to have a single colored layer, it is also possible to have more than one colored layer, and the different layers can have the same or different compositions, as long as they all function as described above. The total thickness of the combined colored layers should be in the range given above.

Additional Additives

Other materials can be present as additives in the colored layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer. Additives may add unwanted color for color proofing applications, or they may decrease durability and print life in lithographic printing applications.

Additional Layers

The donor element may have additional layers (not shown) as well. For example, an antihalation layer may be used on the side of the flexible ejection layer opposite the colored layer. Materials which can be used as antihalation agents are well known in the art. Other anchoring or subbing layers can be present on either side of the flexible ejection layer and are also well known in the art.

In some embodiments of this invention, a pigment, such as carbon black, is present in a single layer, termed the top layer. This type of pigmnent functions as both a heat absorber and a colorant, and thus the top layer has a dual function of being both a heating layer and a colored or transfer layer. The characteristics of the top layer are the same as those given for the colored layer. A preferred colorant/heat absorber is carbon black.

Further Embodiments of the Thermally Imageable Element

Other thermally imageable elements may comprise alternate colored layer or layers on a support. Additional layers may be present depending of the specific process used for imagewise exposure and transfer of the formed images. Some suitable thermally imageable or donor elements are disclosed in U.S. Pat. No. 5,773,188, U.S. Pat. No. 5,622, 795, U.S. Pat. No. 5,593,808, U.S. Pat. No. 5,334,573, U.S. Pat. No. 5,156,938, U.S. Pat. No. 5,256,506, U.S. Pat. No. 5,427,847, U.S. Pat. No. 5,171,650 and U.S. Pat. No. 5,681,681.

Receiver Element

Figure 2:
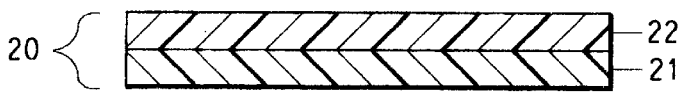
FIG. 2 illustrates a receiver element (20) useful in the invention having a receiver support (21) and an image receiving layer (22).

The receiver element (20), shown in FIG. 2, is the second part of the laserable assemblage, to which the exposed areas of the thermally imageable layer, comprising non-degraded polymer (polymeric binder) and colorant, are transferred. In most cases, the exposed areas of the thermally imageable layer will not be removed from the donor element in the absence of a receiver element. That is, exposure of the donor element alone to laser radiation does not cause material to be removed, or transferred. The exposed areas of the thermally imageable layer, are removed from the donor element only when it is exposed to laser radiation and the donor element is in contact with or adjacent to the receiver element. In the preferred embodiment, the donor element actually touches the receiver element.

The receiver element (20) may be non-photosensitive or photosensitive. The non-photosensitive receiver element preferably comprises a receiver support (21) and an image receiving layer (22). The receiver support (21) comprises a dimensionally stable sheet material. The assemblage can be imaged through the receiver support if that support is transparent. Examples of transparent films for receiver supports include, for example polyethylene terephthalate, polyether sulfone, a polyimide, a poly(vinyl alcohol-co-acetal), polyethylene, or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for proofing applications, while a polyester support, such as poly(ethylene terephthalate) is typical and is preferred for a medical hardcopy and color filter array applications. Roughened supports may also be used in the receiver element.

The image-receiving layer (22) may be a coating of, for example, a polycarbonate; a polyurethane; a polyester; polyvinyl chloride; styrene/acrylonitrile copolymer; poly (caprolactone); vinylacetate copolymers with ethylene and/or vinyl chloride; (meth)acrylate homopolymers (such as butyl-methacrylate) and copolymers, polycaprolactone; and mixtures thereof. Preferably the image receiving layer is a crystalline polymer layer. The image receiving layer polymers preferably have melting points in the range of 50 to 64° C., more preferably 56 to 64° C., and most preferably 58 to 62° C. Blends made from 5–40% Capa® 650 (melt range 58–60° C.) and Tone® P-300 (melt range 58–62° C.), both polycaprolactones, are useful in this invention. Preferably, 100% Tone P-300 is used. Useful receiver elements are also disclosed in U.S. Pat. No. 5,534,387 issued on Jul. 9, 1996. One preferred example is the WaterProof® Transfer Sheet sold by DuPont. Preferably, it has an ethylene/vinyl acetate copolymer in the surface layer comprising more ethylene than the vinyl acetate.

This image-receiving layer can be present in any amount effective for the intended purpose. In general, good results have been obtained at coating weights of range of 10 to 150 mg/dm$^2$, preferably 40 to 60 mg/m$^2$.

In addition to the image-receiving layer, the receiver element may optionally include one or more other layers (not shown) between the receiver support and the image receiving layer. An additional layer between the image-receiving layer and the support is a release layer. The receiver support alone or the combination of receiver support and release layer may also be referred to as a first temporary carrier. The release layer can provide the desired adhesion balance to the receiver support so that the image-receiving layer adheres to the receiver support during exposure and separation from the donor element, but promotes the separation of the image receiving layer from the receiver support upon transfer, for example by lamination, of the image receiving layer to a permanent substrate or support. Examples of materials suitable for use as the release layer include polyamides, silicones, vinyl chloride polymers and copolymers, vinyl acetate polymers and copolymers and plasticized polyvinyl alcohols. The release layer can have a thickness in the range of 1 to 50 microns. A cushion layer which is a deformable layer may also be present in the receiver element, typically between the release layer and the receiver support. The cushion layer may be present to increase the contact between the receiver element and the donor element when assembled. Examples of suitable materials for use as the cushion layer include copolymers of styrene and olefin monomers such as styrene/ethylene/butylene/styrene, styrene/butylene/styrene block copolymers, and other elastomers useful as binders in flexographic plate applications.

The receiver element is an intermediate element in the process of the invention because the laser imaging step is normally followed by one or more transfer steps by which the exposed areas of the thermally imageable layer are transferred to the permanent substrate.

Image Rigidification Element

Figure 3:
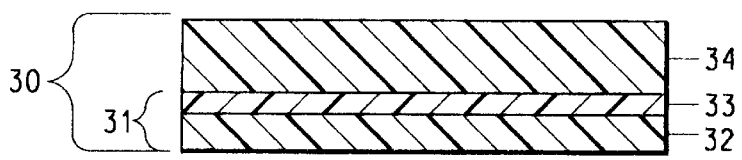
FIG. 3 illustrates an image rigidification element (30) useful the invention having a support having a release surface (31) and a thermoplastic polymer layer (34).

The image rigidification element (30), shown in FIG. 3, comprises a support having a release surface (31), also referred to as a second temporary carrier, and a thermoplastic polymer layer (34).

Support Having a Release Surface or Second Temporary Carrier

The support having a release surface or second temporary carrier (31) may comprise a support (32) and a surface layer (33) which may be a release layer. If the material used as the support, has a release surface, e.g., polyethylene or a fluoropolymer, no additional surface layer is needed. The surface or release layer (33) should have sufficient adhesion to the support (32) to remain affixed to the support throughout the processing steps of the invention. Almost any material that has reasonable stiffness and dimensional stability is useful as the support. Some examples of useful supports include polymeric films such as polyesters, including polyethylene terephthalate and polyethylene naphthanate; polyamides; polycarbonates; fluoropolymers; polyacetals; polyolefins, etc. The support may also be a thin metal sheet or a natural of synthetic paper substrate. The support may be transparent, translucent or opaque. It may be colored and may have incorporated therein additives such as fillers to aid in the movement of the image rigidification element through the lamination device during its lamination to the color image containing receiver element.

The support may have antistatic layers coated on one or both sides. This may be useful in reducing static when the support is removed from the thermoplastic polymer layer during the process of the invention. It is generally preferred to have antistatic layers coated on the back side of the support, i.e., the side of the support away from the thermoplastic polymer layer. Materials which can be used as antistatic materials are well known in the art. Optionally, the support may also have a matte texture to aid in transport and handling of the image rigidification element.

The support typically has a thickness of about 20μ to about 250μ. A preferred thickness is about 55 to 200μ.

The release surface of the support may be provided by a surface layer (33). Release layers are generally very thin layers which promote the separation of layers. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the support, the layer generally has a thickness in the range of 0.5 to 10 micrometers.

The release layer (33) may also include materials such as antistats, colorants, antihalation dyes, optical brighteners, surfactants, plasticizers, coating aids, matting agents, and the like.

Thermoplastic Polymer Layer

Thermoplastic polymers useful in this layer are preferably amorphous, i.e., non-crystalline, in character, have high softening points, moderate to high molecular weight and compatibility with the components of the image receiving polymer layer, e.g., polycaprolactone. Additionally, flexibility without cracking and possessing the capability to be attached to many different permanent substrates is advantageous. The polymer is preferably solvent soluble, has good solvent and light stability and is a good film former.

There are many useful thermoplastic polymer materials. Preferred for use in this invention are thermoplastic polymers having Tgs (glass transition temperatures) in the range of about 27 to 150° C., preferably 40 to 70° C., and more preferably 45 to 55° C., a relatively high softening points, e.g., Tg of 47° C., melt flow of 142° C.), low elongations at break as determined by ASTM D822A of e.g., 3, and moderate weight average molecular weight (Mw), e.g., in the area of 67,000. Polyester polymers, e.g., having a Tg of about 47° C., are preferred because good compatibility is achieved between the image receiving polymer, e.g., crystalline polycaprolactone and the polyester polymer in the image rigidification layer. However, other suitable polymers have been shown to give acceptable results. Some suitable materials include methacrylate/acrylate, polyvinylacetate, polyvinylbutyral, polyvinylformal, styrene-isoprene-styrene and styrene-ethylene-butylene-styrene polymers, etc.

The thermoplastic polymer is present in the amount of about 60 to 90%, preferably about 70 to 85%, based on the total weight of the thermoplastic polymer layer components.

The thermoplastic polymer layer and image receiving layer relate to each other in that the colored image is encased between them so that it does not move significantly during lamination to the permanent substrate, e.g., paper, and cooling. This significantly reduces halftone dot movement, swath boundary cracking and banding compared to similar processes not employing a thermoplastic polymer layer in this manner, i.e., an image rigidification element, and renders them barely perceptible or substantially eliminated.

The use of the thermoplastic polymer layer in the processes and products of this invention results in an increase in lamination throughput speeds from 200mm/min to approximately 600–800 mm/min (3–4 fold increase) without the introduction of defects, and provides lamination process latitude to allow image transfer to many different types of permanent substrates.

The thermoplastic polymer layer also provides a vehicle or mechanism for the introduction of bleaching chemistry to reduce the impact on final color associated with the NIR dye in the transferred color image to the permanent substrate.

Additives

The thermoplastic polymer layer may also contain additives as long as they do not interfere with the functioning of this layer. For example, additives such as plasticizers, other modifying polymers, coating aids, surfactants can be used. Some useful plasticizers include polyethylene glycols, polypropylene glycols, phthalate esters, dibutyl phthalate and glycerine derivatives such triacetin. Preferably, the plasticizer is present in the amount of about 1 to 20%, most preferably 5 to 15%, based on the total weight of the thermoplastic polymer layer components.

As noted above, the thermoplastic polymer layer also preferably contains dye bleaching agents for bleaching the thermal amplification additive, such as an NIR dye, which may be present in the thermally imageable or donor element and/or the receiver element. Some useful bleaching agents include amines, azo compounds, carbonyl compounds and, organometallic compounds, and carbanions. Useful oxidants include peroxides, diacyl peroxides, peroxy acids, hydroperoxides, persulfates, and halogen compounds. Particularly preferred dye bleaching agents with polymethine type NIR dyes are those selected from the group consisting of hydrogen peroxide, organic peroxides, hexaaryl biimidazoles, halogenated organic compounds, persulfates, perborates, perphosphates, hypochlorites and azo compounds.

Dye bleaching agents are present in the amount of about 1 to 20%, preferably 5 to 15%, based on the total weight of the thermoplastic polymer layer components.

Permanent Substrate

One advantage of the process of this invention is that the permanent substrate, also known as a permanent support or final receptor, for receiving the colored image can be chosen from almost any sheet material desired. For most proofing applications a paper support is used, preferably the same paper on which the image will ultimately be printed. Most any paper stock can be used. Other materials which can be used as the permanent substrate include cloth, wood, glass, china, most polymeric films, synthetic papers, thin metal sheets or foils, etc. Almost any material which will adhere to the thermoplastic polymer layer (34), can be used as the permanent substrate.

Process Steps

Exposure

Figure 4:
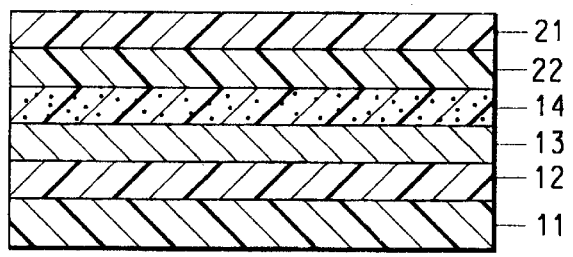
FIG. 4 illustrates the donor element (10) in contact with the receiver element (20) forming a sandwich with the colored layer (14) adjacent the image receiving layer (22).

The first step in the process of the invention is imagewise exposing the laserable assemblage, e.g., as shown in FIG. 4, to laser radiation. The exposure step is preferably effected at a laser fluence of about 600 mJ/cm$^2$ or less, most preferably about 250 to 440 mJ/cm$^2$. The laserable assemblage comprises the donor element and the receiver element, described above.

The assemblage is normally prepared following removal of coversheet(s), if present, by placing the donor element in contact with the receiver element such that colored layer actually touches the image-receiving layer on the receiver element. This is represented in FIG. 4. Vacuum and/or pressure can be used to hold the two elements together. Alternately, the donor and receiver elements may be spaced slightly apart using spacer particles in the colored layer or the image receiving layer. As one alternative, the donor and receiver elements can be held together by fusion of layers at the periphery. As another alternative, the donor and receiver elements can be taped together and taped to the imaging apparatus, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

The exposure can take place through the flexible ejection layer or subbing layer of the donor element or through the receiver element, provided that these are substantially transparent to the laser radiation. In most cases, the donor flexible ejection layer or subbing layer will be a film which is transparent to infrared radiation and the exposure is conveniently carried out through the flexible ejection or subbing layer. However, if the receiver element is substantially transparent to infrared radiation, the process of the invention can also be carried out by imagewise exposing the receiver element to infrared laser radiation.

The laserable assemblage is exposed imagewise so that the exposed areas of the thermally imageable layer are transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

Figure 5:
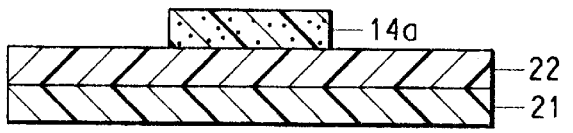
FIG. 5 illustrates the receiver element (20) having an image (14a) present on the image receiving layer (22) resulting from exposure of the sandwich in FIG. 4, followed by separation of the donor element and the receiver element.

As shown in FIG. 5, separation results in a laser generated color image, also known as the colored image, preferably a halftone dot image, comprising the transferred exposed areas of the thermally imageable layer, being revealed on the image receiving layer of the receiver element. Preferably the colored image formed by the exposure and separation steps is a laser generated halftone dot color image formed on a crystalline polymer layer, the crystalline polymer layer being located on a first temporary carrier.

Lamination of the Image Rigidification Element

Figure 6:
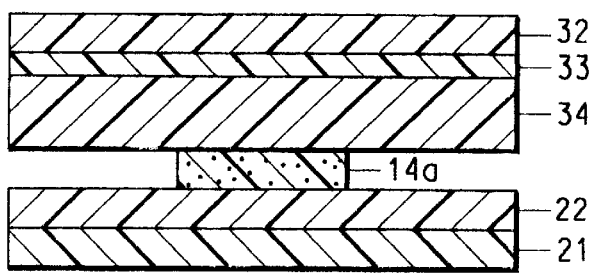
FIG. 6 illustrates the image rigidification element (30) in contact with the image receiving layer (22) having thereon the colored image (14a), with the colored image (14a) encased between the thermoplastic polymer layer (34) and the image receiving layer (22).

The image rigidification element is then brought into contact with, preferably laminated to, the image receiver element with the colored image in contact with the thermoplastic polymer layer of the image rigidification element resulting in the thermoplastic polymer layer of the rigidification element and the image receiving layer of the receiver element encasing the color image. This is best seen in FIG. 6. A WaterProof® Laminator, manufactured by DuPont is preferably used to accomplish the lamination. However, other conventional means may be used to accomplish contact of the image carrying receiver element with the thermoplastic polymer layer of the rigidification element. It is important that the adhesion of the rigidification element support having a release surface (31), also known as the second temporary carrier, to the thermoplastic polymer layer (34) be less than the adhesion between any other layers in the sandwich. The novel assemblage or sandwich, e.g., as illustrated by FIG. 6, is highly useful, e.g., as an improved image proofing system.

Transfer of the Image to the Permanent Substrate

Figure 6A:
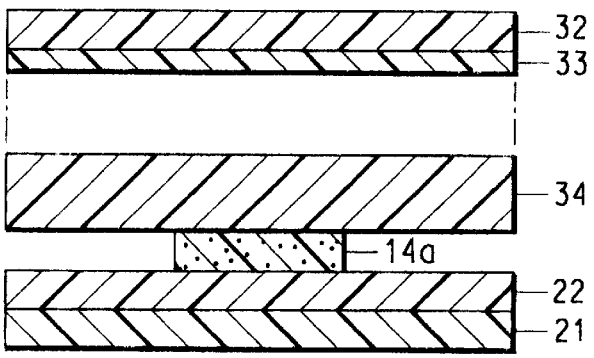
FIG. 6a illustrates the sandwich in FIG. 6 following removal of the rigidification support having a release surface (31).

The support (32) having a release surface (33) (or second temporary carrier) is then removed, preferably by peeling off, to reveal the thermoplastic film as seen in FIG. 6a. The color image on the receiver element is then transferred to the permanent substrate by contacting the permanent substrate with, preferably laminating it to, the revealed thermoplastic polymer layer of the sandwich shown in FIG. 6a. Again a WaterProof® Laminator, manufactured by DuPont, is preferably used to accomplish the lamination. However, other conventional means may be used to accomplish this contact which results in the sandwich shown in FIG. 7.

Figure 7:
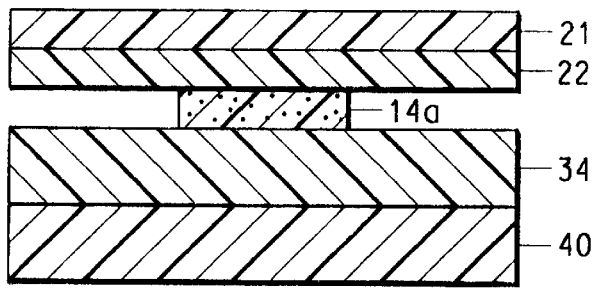
FIG. 7 illustrates the sandwich resulting from the lamination of the sandwich shown in FIG. 6a to the permanent substrate (40), e.g., paper, with the thermoplastic polymer layer (34) adjacent the paper.
Figure 8:
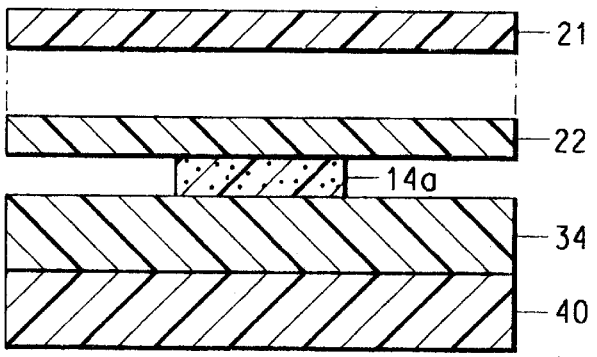
FIG. 8 illustrates the final element, e.g., a printed proof, formed when the support (21) is separated from the image receiving layer(22).

Another embodiment includes the additional step of removing, preferably by peeling off, the receiver support (21) (also known as the first temporary carrier), resulting in the assemblage or sandwich shown in FIG. 8. In a preferred embodiment, the assemblages illustrated in FIGS. 7 and 8 represent a printing proof comprising a laser generated halftone dot color thermal image formed on a crystalline polymer layer, and a thermoplastic polymer layer laminated on one surface to said crystalline polymer layer and laminated on the other surface to the permanent substrate, whereby the color image is encased between the crystalline polymer layer and the thermoplastic polymer layer.

Formation of Multicolor Images

In proofing applications, the receiver element can be an intermediate element onto which a multicolor image is built up. A thermally imageable element having a thermally imageable colored layer comprising a first colorant is exposed and separated as described above. The receiver element has a colored image formed with the first colorant, which is preferably a laser generated halftone dot color thermal image. Thereafter, a second thermally imageable element having a thermally imageable or colored layer different than that of the first thermally imageable element forms a laserable assemblage with the receiver element having the colored image of the first colorant and is imagewise exposed and separated as described above. The steps of (a) forming the laserable assemblage with a thermally imageable element having a different colorant than that used before and the previously imaged receiver element, (b) exposing, and (c) separating are sequentially repeated as often as necessary in order to build the multicolored image of a color proof on the receiver element.

The rigidification element is then brought into contact with, preferably laminated to, the multiple colored images on the image receiving element with the last colored image in contact with the thermoplastic polymer layer. The process is then completed as described above.

EXAMPLES

These non-limiting examples demonstrate the processes and products claimed and described herein wherein images of a wide variety of colors are obtained. All temperatures throughout the specification are in ° C. (degrees Centigrade) and all percentages are weight percentages unless indicated otherwise.

The following elements were prepared:

Thermally Imageable Elements

Black, cyan, magenta and yellow thermally imageable or donor elements were made by coating aqueous solutions comprised of the compositions below in Table 1 with a wire wound rod (#5) and dried to a thickness of 12–14 mg/dm$^2$ on chrome treated Melinex® 562. Melinex® 562 is sold by DuPont and chrome treatment was performed by CP Films. The chrome thickness can range between 40 to 80 angstroms on Melinex® 562.

TABLE 1

| Material | Yellow | Black | Magenta | Cyan |
|---|---|---|---|---|
| PC Yellow Hansa 32Y144d[1] | 10% | | | |
| PC Yellow HR 32Y145D[1] | 3% | | | |
| Penn Color Cyan 32S34D[1] | | | | 12.3% |
| Penn Color Black 32B56[2] | | 17% | | |
| Penn Color Magenta 32R80D[1] | | | 16.5% | |
| MMA//nBMA (75//25)[3] | 77.7% | 70% | 73.0% | 77.1% |
| PEG-300[4] | 3% | 8% | 3.1% | 3.1% |
| SDA 4927[5] | 1.3% | | 1.4% | 1.4% |
| BYK-345[6] | 5% | 5% | 6.0% | 6.1% |
| Total | 100% | 99% | 100% | 100% |
| % Solids in water | 15% | 15% | 15% | 15% |

[1]40% solids in water, pigment purchased from Penn Color, Doylestown, PA
[2]44.2% solids in water, pigment purchased from Penn Color, Doylestown, PA
[3]methyl methacrylate//n-butyl methacrylate block polymer
[4]100% solids, polyethylene glycol, purchased from Scientific Polymer Products, Ontario, NY.
[5]100% solids, Benz(e) indolium cyanine NIR dye, purchased from H. W. Sands, Jupiter, FL.
[6]100% solids, silicone type surfactant, purchased from BYK Chemie GmbH Receiver Element 1

A receiver element, comprised of 100% Tone P-300 (Polycaprolactone, crystalline polymer, melt range 58–62° C., Union Carbide) was made by coating a 15% solids solution in tetrahydrofuran (THF) to a dried thickness of 53 mg/dm$^2$ on 300 gauge EB-11 Mylar® polyester film, as a receiver support (or first temporary carrier) having a release surface (sold by DuPont). The dried coating thickness was 50–55 mg/dm and comprised the image receiving layer.

Receiver Element 2

11.25 grams of Tone® P-300 and and 3.75 grams of Capa® 650 (Polycaprolactone, crystalline polymer, melt point 60° C., Solvay-Interox) were coated and dried as described for Receiver Element 1 to form the image receiving element.

Receiver Element 3

A WaterProof® Transfer Sheet described in U.S. Pat. No. 5,534,387, issued on Jul. 9, 1996, and commercially available from DuPont, as Stock #G06086, was used.

Image Rigidification Element 1

A thermoplastic layer was made by dissolving 15 g of a Vitel® 2700B (Tg 47° C., melt flow 142° C., Mw of 67000, linear saturated polyester, available from Bostik, Inc) in 35 g of 2-Butanone, and coating the solution on slip treated Melinex® 377 polyester film, (sold by DuPont and slip-treated with a silicone release layer by Furon, Inc., Worcester, Mass.) using a #10 wire wound rod. The coating was dried to a thickness of 55 mg/dm² to form the image rigidification layer. Hot air was used to remove residual solvent. Vitel® 2700B on the slip treated Melinex® comprised a thermoplastic polymer layer on a support having a release surface.

Image Rigidification Element 2

An image rigidification layer incorporating a plasticizer and an NIR dye bleaching agent was made by coating the following composition with a #10 wire wound rod on slip treated Melinex® 377 polyester film, as the support having a release surface, and dried thickness of 55 mg/dm².

TABLE 2

| Ingredient | Amount (grams) | % solids |
|---|---|---|
| 2-Butanone (solvent) | 52.5 | |
| Dibutyl Phthlate (plasticizer) | 1.1 | 5 |
| 3-Chloroperbenzoic acid (NIR dye bleaching agent) | 1.1 | 5 |
| Vitel ® 2700B (thermoplastic polymer) | 20.3 | 90 |

EXAMPLE 1

The black, cyan, magenta and yellow donor sheets and Receiver element 1 were placed in the cassette of a Creo Spectrum Trendsetter, Creo, Vancouver, BC, and sequentially imaged under the following conditions: conditions: yellow (13.0 watts, 150 rpm), magenta (13.5 watts, 135 rpm), cyan (14.5 watts, 135 rpm), black (12.5 watts, 170 rpm). The computer attached to the Trendsetter contained digital data files representing the 4 process colors (yellow, magenta, cyan and black).

This imaging equipment produced a laser generated 4 color thermal digital halftone image (proof) in reverse reading form on the Receiver Element 1 from the digital image data file representing each respective color. Exposure was effected at a laser fluence of about 250 mJ/cm².

Image Rigidification Element 1 was positioned over the color image on a WaterProof® Carrier Plate (DuPont) with the image receiving layer in direct contact with the image. Care was taken to ensure that all air was removed prior to lamination between the layers by smoothing the Rigidification Element 1 with a WaterProof® Antistatic Brush (DuPont). This 'sandwich' structure was laminated together with a WaterProof® Laminator (DuPont) at the following setting (120° C. top roll, 115° C. bottom roll; 150#; 800 mm/min). The support (second temporary carrier) was then removed from the sandwich leaving behind the 4-color digital image encased between the thermoplastic polymer layer of the Image Rigidification Element and the image receiving layer on the Receiver Element 1.

The presence of the NIR Dye SDA 4927 was determined by taking a UV/Visible spectrum of the individual yellow, magenta and cyan colors in the solid image areas using the native Receiver Element 1 as the reference. The presence of the 838 nm peak was noted and the absorbance recorded. Results are shown in Table 3 below.

The above sandwich structure was placed on top a final permanent substrate (Lustro Gloss #100 paper) with the thermoplastic polymer layer down and laminated with the standard WaterProof® laminator (DuPont) using the paper setting (120° C. top roll, 115° C. bottom roll; 450#; 600 mm/min). After allowing the sandwich to cool (about 2 minutes), the receiver support (first temporary carrier) was removed leaving behind a 4 color halftone dot thermal image on paper. Defects such as dot movement, banding and swath boundary cracking were significantly reduced, compared to similar processes not employing the image rigidification element, and rendered barely perceptible or substantially eliminated.

EXAMPLE 2

Example 1 was repeated except, that Image Rigidification Element 2 was laminated to the image. The presence of the NIR Dye SDA 4927 was again determined by taking a UV/Visible spectrum of the individual yellow, magenta and cyan colors in the solid image areas of the proof using the native Receiver Element 1 as the reference. As shown in Table 3, a complete absence of the 838 nm peak was noted in all yellow, magenta and cyan UV/Visible spectra indicating that the NIR dye had been bleached. The term bleaching refers to the complete loss (or significant reduction) of absorbance at 838 nm and no other significant extraneous peaks in the visible spectrum (400–700 nm) are present.

TABLE 3

| Example | Color | Dye Bleaching Agent | Absorbance |
|---|---|---|---|
| 2 | Yellow | Yes | 0.02 |
| 1 | Yellow | No | 0.31 |
| 2 | Magenta | Yes | 0.0 |
| 1 | Magenta | No | 0.35 |
| 2 | Cyan | Yes | 0.0 |
| 1 | Cyan | No | 0.36 |

Defects such as dot movement, banding and swath boundary cracking were significantly reduced, compared to similar processes not employing the image rigidification element, and rendered barely perceptible or substantially eliminated.

EXAMPLE 3

Example 1 was repeated with the following exception: Rigidification Element 2 was laminated to a thermally generated 4-color halftone dot image on Receiver Element 1. The presence of the NIR Dye SDA 4927 was determined by taking a UV/Visible spectrum of the individual green, red and blue colors in the solid image areas of the proof using the native Receiver element 1 as the reference. As shown in Table 4, a complete absence of the 838 nm peak was noted in all 2 color solids—red, green and blue overprints. The UV/Visible spectra indicated that the NIR dye had been bleached as above defined.

A control was run along side the experiment where a sample of the original donor sheet with the NIR dye was present to verify loss of the 838 nm peak.

TABLE 4

| Color | Absorbance |
|---|---|
| Blue | 0.0 |
| Blue Control | 0.79 |
| Red | 0.0 |
| Red Control | 0.58 |
| Green | 0.0 |
| Green Control | 0.64 |

Defects such as dot movement, banding and swath boundary cracking were significantly reduced, compared to similar processes not employing the image rigidification element, and rendered barely perceptible or substantially eliminated.

EXAMPLE 4

Example 1 was repeated with the following exception: Receiver Element 1 was replaced with the WaterProof®

Transfer Sheet (DuPont) as previously described. The Image Rigidification Film, from Example 2, was laminated to a thermally generated 4-color halftone dot image. The presence of the NIR Dye SDA 4927 was determined by taking a UV/Visible spectrum of the individual yellow, magenta and cyan colors in the solid image areas of the proof, using the same pigments in Table 1, and using the native Water-Proof® Transfer Sheet as the reference. A complete absence of the 838 nm peak was noted in all yellow, magenta and cyan solid colors. The UV/Visible spectra indicated that the NIR dye had been bleached. The term bleaching refers to the complete loss (or significant reduction) of absorbance at 838 nm and no other significant extraneous peaks in the visible spectrum (400–700 nm) are present.

Defects such as dot movement, banding and swath boundary cracking were significantly reduced, compared to similar processes not employing the image rigidification element, and rendered barely perceptible or substantially eliminated.

EXAMPLE 5

Example 1 was repeated with the following exception: the image rigidification elements used were prepared by coating the solutions shown in Table 5 (in place of the Vitel® 2700B) on slip treated Melinex® 377 polyester film, and then drying to a film thickness of ~55 mg/dm². The image rigidification elements comprised the indicated thermoplastic polymer layer on the polyester film support having a release surface (second temporary carrier).

TABLE 5

| | AMOUNT(GRAMS) | | | | |
|---|---|---|---|---|---|
| INGREDIENT | 5a | 5b | 5c | 5d | 5e |
| Toluene | 40 | 40 | | | |
| Methanol | | | 40 | | 38 |
| Water | | | | | 2 |
| Acetone | | | | 40 | |
| Butvar ® B-90[1] | | | 10 | | |
| Kraton ® 1107[2] | 10 | | | | |
| Kraton ® G1652[3] | | 10 | | | |
| Vinac ® B-15[4] | | | | 10 | |
| Carboset ® 525[5] | | | | | 10 |

[1]is polyvinyl butyral, Tg 62–68° C., manufactured by Monsanto, St. Louis, MO
[2]is a styrene/isoprene/styrene block copolymer; Tg 93/–55° C., manufactured by Shell Chemical Co., Houston, TX
[3]is a styrene/ethylene/butylene/styrene block polymer, Tg 93/–65° C., manufactured by Shell Chemical Co., Houston, TX
[4]is polyvinyl acetate, Tg 29–42° C., manufactured by B. F. Goodrich, Cleveland, OH
[5]is a methyl methacrylate, ethyl acrylate, acrylic acid polymer, Tg 37° C., manufactured by Air Products and Chemical, Inc., Allentown, PA 4 color halftone dot thermal images encased between the thermoplastic polymer and the image receiving layer on the receiver element were formed on the paper substrate. Defects such as dot movement, banding and swath boundary cracking were significantly reduced, compared to similar processes not employing the image rigidification element, and rendered barely perceptible or substantially eliminated.

EXAMPLE 6

Imation MatchPrint® LaserProof—Black, Yellow, Magenta and Cyan Donor Films, available from Imation, Minneapolis, Minn., were used as the thermally imageable element. Imation MatchPrint® LaserProof Image Receiver was used as the receiver element.

The following steps were then carried out to produce a MatchPrint® LaserProof. The black, yellow, magenta and cyan MatchPrint® LaserProof donor films and Image Receiver were loaded into the cassette of a Creo Spectrum Trendsetter. A four color digital halftone color image on the Receiver was obtained by setting the imaging conditions (in overwrite mode) at:

| | |
|---|---|
| Black: 14 watts/150 rpm | Magenta: 17 watts/123 rpm |
| Cyan: 17 watts/150 rpm | Yellow: 17 watts/150 rpm |

The computer attached to the Trendsetter contained digital image data files representing the 4 process colors (yellow, magenta, cyan and black).

Image Rigidification Element prepared in Example 5, identified as 5a was laminated to the MatchPrint® Laser-Proof Receiver Sheet containing the 4 color halftone digital image in the same manner described in Example 1. The sandwich structure from the previous step was placed on top of a final paper substrate (Lustro Gloss #100), as permanent substrate, and laminated with the standard WaterProof® laminator (DuPont) using the paper setting. After allowing the sandwich to cool (about 2 minutes), the receiver support from the MatchPrint® LaserProof Image Receiver was removed leaving behind a 4 color halftone dot thermal image on paper encased between the thermoplastic polymer layer formed using the 5a solution and the image receiving layer left behind when the receiver support from the Match-Print® LaserProof Image Receiver was removed. It is expected that defects such as dot movement, banding and swath boundary cracking would be significantly reduced, compared to similar processes not employing the image rigidification element, and rendered barely perceptible or substantially eliminated.

EXAMPLE 7

Example 1 was repeated with the following exception:

A 3 mil polyester substrate (300 A Mylar®, DuPont) was used in place of the paper as the permanent substrate resulting in a 4 color thermal halftone dot image on the 300 A Mylar® polyester sheet. Defects such as dot movement, banding and swath boundary cracking were significantly reduced, compared to similar processes not employing the image rigidification element, and rendered barely perceptible or substantially eliminated.

EXAMPLE 8

Example 1 was repeated with the following exception:

An anodized Aluminum plate was used in place of the paper as the permanent substrate resulting in a 4 color thermal halftone dot image on the Aluminum plate. Defects such as dot movement, banding and swath boundary cracking were significantly reduced, compared to similar processes not employing the image rigidification element, and rendered barely perceptible or substantially eliminated.

What is claimed is:

1. An image proofing system comprising:
   (a) a laser generated halftone dot color thermal image comprising a pigment colorant formed on a crystalline polymer layer, the crystalline polymer layer being located on a first temporary carrier; and
   (b) a thermoplastic polymer layer laminated to the crystalline polymer layer whereby the color image is encased between the crystalline polymer layer and the thermoplastic polymer layer, the thermoplastic polymer layer being located on a second temporary carrier.

2. The image proofing system of claim 1 wherein the crystalline polymer is polycaprolactone.

3. The image proofing system of claim 2 wherein the crystalline polymer has a melting point of 50 to 64° C.

4. The image proofing system of claim 3 wherein the crystalline polymer has a melting point of 56 to 64° C.

5. The image proofing system of claim 4 wherein the crystalline polymer has a melting point of 58 to 62° C.

6. The image proofing system of claim 1 wherein the thermoplastic polymer has a Tg in the range of 30 to 150° C.

7. The image proofing system of claim 6 wherein the thermoplastic polymer has a Tg in the range of 40 to 70° C.

8. The image proofing system of claim 7 wherein the thermoplastic polymer has a Tg in the range of 40 to 55° C.

9. The image proofing system of claim 1 wherein the thermoplastic polymer is polyester.

10. The image proofing system of claim 1 wherein the first and second temporary carriers comprise polyester.

11. The image proofing system of claim 1 wherein the first and second temporary carriers have release surfaces.

12. The image proofing system of claim 1 wherein the crystalline polymer layer comprises an NIR dye.

13. The image proofing system of claim 12 wherein the thermoplastic polymer layer contains an NIR dye bleaching agent.

14. A printed proof comprising:
(a) a laser generated halftone dot color thermal image comprising a pigment colorant formed on a crystalline polymer layer; and
(b) a thermoplastic polymer layer laminated on one surface to the crystalline polymer layer and on the other surface to a permanent substrate, whereby the color image is encased between the crystalline polymer layer and the thermoplastic polymer layer.

15. The printed proof of claim 14 wherein the crystalline polymer has a melting point of 50 to 64° C.

16. The printed proof of claim 15 wherein the crystalline polymer has a melting point of 56 to 64° C.

17. The printed proof of claim 16 wherein the crystalline polymer has a melting point of 58 to 62° C.

18. A printed proof of claim 14 wherein the crystalline polymer is polycaprolactone.

19. The printed proof of claim 14 wherein the thermoplastic polymer has a Tg in the range of 30 to 150° C.

20. The method of claim 19 wherein the thermoplastic polymer has a Tg in the range of 40 to 70° C.

21. The method of claim 20 wherein the thermoplastic polymer has a Tg in the range of 40 to 55° C.

22. The printed proof of claim 14 wherein the thermoplastic polymer is polyester.

23. The printed proof of claim 14 wherein the color image contains an NIR dye.

24. The printed proof of claim 23 wherein the thermoplastic polymer layer contains a dye bleaching agent which has effectively bleached the NIR dye.

25. The printed proof of claim 14 wherein the permanent substrate is paper.

26. A printed proof comprising in order:
(a) a receiver support;
(b) an image receiving layer;
(c) a thermal halftone dot color image comprising a pigment colorant;
(d) a thermoplastic polymer layer; and
(e) a paper substrate; wherein the color image is encased between the image receiving layer and the thermoplastic polymer layer.

27. The printed proof of claim 26 wherein the receiver support is transparent.

28. The printed proof of claim 26 wherein the receiver support is removed.

29. The printed proof of claim 26 which comprises at least four thermal halftone dot color images of different colors encased between the image receiving layer and the thermoplastic polymer layer.

30. A method of bleaching an NIR dye of a receiver element comprising a laser generated color thermal image formed on the receiver element which comprises contacting the color thermal image with an image rigidification element comprising a thermoplastic layer containing a peroxy acid for bleaching the NIR dye.

31. The method of claim 30 in which the peroxy acid is 3-chloroperbenzoic acid.

32. The method of claim 30 further comprising the step of laminating the outer surface of the image rigidification element to a permanent substrate.

33. The method of claim 30 in which the thermoplastic layer is an amorphous polymer.

34. The method of claim 30 in which the thermoplastic layer is polyester.

35. The method of claim 30 in which the thermoplastic layer is methacrylate, acrylate, polyvinylacetate, polyvinylbutyral, polyvinylformal, styrene-isoprene-styrene or styrene-ethylene-butylene-styrene.

36. The method of claim 30 in which the laser generated color thermal image is formed on a polycaprolactone layer of the receiver element.

37. The method of claim 30 in which the NIR dye is polymethine.

38. A method for improving color purity in a thermal transfer color imaging process utilizing an NIR dye, comprising encasing the color image comprising a pigment colorant between a crystalline polymer layer and a thermoplastic polymer layer containing an NIR dye bleaching agent comprising a peroxy acid.

39. The method of claim 38 wherein the thermoplastic polymer layer further comprises a plasticizer.

40. The method of claim 39 wherein the plasticizer is present in an amount of about 1 to 20%, based on the total weight of the thermoplastic polymer layer.

* * * * *